(12) United States Patent
Krause

(10) Patent No.: US 7,940,527 B2
(45) Date of Patent: May 10, 2011

(54) COOLING SYSTEM FOR ELECTRONIC STRUCTURAL UNITS

(75) Inventor: Axel Krause, Nesslau (CH)

(73) Assignee: BRUSA Elektronik AG, Sennwald (CH)

( * ) Notice: Subject to any disclaimer, the term of this patent is extended or adjusted under 35 U.S.C. 154(b) by 0 days.

(21) Appl. No.: 12/642,756

(22) Filed: Dec. 18, 2009

(65) Prior Publication Data

US 2010/0091457 A1    Apr. 15, 2010

Related U.S. Application Data

(63) Continuation-in-part of application No. PCT/IB2009/052559, filed on Jun. 16, 2009.

(60) Provisional application No. 61/074,063, filed on Jun. 19, 2008.

(30) Foreign Application Priority Data

Jun. 18, 2008  (CH) .......................................... 932/08

(51) Int. Cl.
*H05K 7/20* (2006.01)

(52) U.S. Cl. ................... 361/699; 361/679.53; 361/698; 361/701; 165/80.4; 165/80.5; 165/147; 257/714; 174/15.1

(58) Field of Classification Search ............ 361/679.46, 361/679.53, 679.54, 688, 689, 698–702, 361/707–714, 717–724; 165/80.2, 80.3, 165/80.4, 80.5, 104.32, 104.33, 104.34, 147, 165/185; 257/713–715, 721; 174/15.1, 16.1, 174/16.3; 62/259.2

See application file for complete search history.

(56) References Cited

U.S. PATENT DOCUMENTS

| | | | | | |
|---|---|---|---|---|---|
| 3,455,376 | A | * | 7/1969 | Beurtheret | 165/133 |
| 4,103,737 | A | * | 8/1978 | Perkins | 165/109.1 |
| 4,699,208 | A | * | 10/1987 | Wolf et al. | 165/47 |
| 4,909,315 | A | | 3/1990 | Nelson et al. | |
| 4,920,574 | A | | 4/1990 | Yamamoto et al. | |
| 5,002,123 | A | * | 3/1991 | Nelson et al. | 165/147 |
| 5,072,787 | A | * | 12/1991 | Nakamichi | 165/80.3 |

(Continued)

FOREIGN PATENT DOCUMENTS

DE    1614521 A1    2/1970

(Continued)

OTHER PUBLICATIONS

Search Report and Intn'l. Preliminary Report on Patentability, parent application PCT/IB2009/052559 filed Jun. 16, 2009.

(Continued)

*Primary Examiner* — Michael V Datskovskiy
(74) *Attorney, Agent, or Firm* — George Kapsalas; Patentbuero Paul Rosenich AG

(57) ABSTRACT

Cooling systems (1) suitable for cooling an electronic unit (2) or assembly. The cooling system is provided with a cooling channel (6). An electronic unit (2) rests over a heat-conducting cooler wall (7). A coolant guide apparatus (11) is provided in the cooling channel (6) and has insert conduit elements (13) for guiding the coolant onto the cooler wall indentations (12). The end of each insert conduit (13) opening to the cooling channel (6) may be provided with an inclined entry surface (19) and an inlet opening (20) towards the inner longitudinal channel (14). A plurality of such coolant guides (11) may be arranged in series so that, for example, the same cooling medium flows through a plurality of semiconductor modules in succession.

22 Claims, 15 Drawing Sheets

U.S. PATENT DOCUMENTS

| | | | |
|---|---|---|---|
| 5,228,502 A | 7/1993 | Chu et al. | |
| 5,239,443 A | 8/1993 | Fahey et al. | |
| 6,386,278 B1 * | 5/2002 | Schulz-Harder | 165/167 |
| 6,431,260 B1 * | 8/2002 | Agonafer et al. | 165/80.4 |
| 7,044,212 B1 * | 5/2006 | Hofmann | 165/185 |
| 7,208,872 B2 * | 4/2007 | Miyadera | 313/512 |
| 7,277,284 B2 * | 10/2007 | Lee et al. | 361/699 |
| 2009/0101313 A1 * | 4/2009 | Hofmann | 165/104.19 |

FOREIGN PATENT DOCUMENTS

| | | |
|---|---|---|
| JP | S62-216349 A1 | 9/1987 |

OTHER PUBLICATIONS

"Multi-Chip Package With Cooling by a Spreader Plate in Contact With a Chip Having Cylindrical Holes Mating With an Inverse Frame Providing Water Flow Within its Pins," from vol. 31, No. 5, Oct. 1, 1998 IBM Technical Disclosure Bulletin, pp. 141-142, publisher IBM Corp., New York, NY.

Andrews, J.A. "Parallel Printed Circuit Manifold," from vol. 7, Oct. 1, 1987 Motorola Technical Developments, pp. 22-23, publisher Motorola Inc., Schaumburg, Illinois.

* cited by examiner

US 7,940,527 B2

COOLING SYSTEM FOR ELECTRONIC STRUCTURAL UNITS

This claims benefit of priority as a continuation-in-part of PCT International application PCT/IB2009/052559 filed on Jun. 16, 2009 designating the U.S. and published as publication No. WO2009/153735A1 on Dec. 23, 2009, claiming the benefit of priority to Swiss national application No. 0932/08 filed on Jun. 18, 2008, and also claiming the benefit of priority to U.S. provisional application No. 61/074,063 filed on Jun. 19, 2008, which priority claims are likewise made in the present application; the entirety of prior PCT International application PCT/IB2009/052559 is expressly incorporated herein by reference as if identically set forth herein in its entirety, for all intents and purposes.

BACKGROUND OF THE INVENTION

The invention relates to a cooling system which is suitable for cooling electronic structural units or assemblies. The cooling system is provided with a housing and, therein, with at least one cooling channel having an inflow and an outflow and intended for a coolant, the electronic structural unit resting over a large area against a heat-conducting cooler wall of the housing.

As is known, the power dissipation and hence the heat evolution of the electronic assemblies are increasing disproportionately with the power-related further development of the electronic structural elements. It is true that these components are becoming smaller and smaller, but their efficiency and hence the heat to be removed are increasing. Furthermore, owing to their compactness, these electronic elements are positioned in a smaller space so that once again a higher local heat evolution results. The power dissipations achieved would be realizable only with complicated and bulky cooling bodies in the case of fan cooling and are therefore unacceptable. In the case of large losses, air cooling therefore clearly reaches its limits.

The new high-performance processors deliver about 70 to 100 W over an area of about 10 cm$^2$ and thus achieve a far higher heat flux density. The processor manufacturers predict that a further increase in the waste heat is to be expected in the years ahead. In view of this development, those skilled in the art are considering liquid cooling for such applications. Liquid cooling more effectively withdraws the heat from the electronic assemblies, with the result that a higher power density is possible. The liquid cooling systems permit more compact switch cabinets with numerous electronic components. The liquid coolers moreover operate quietly and do not tend to give rise to dust or to accumulate particles from surrounding gases, which can furthermore reduce the cooling power.

A prior cooling apparatus is disclosed (e.g. in US-2008/0066888-A1), in which a pin-block is installed in a cooling channel—transversely to the cooling wall of a semiconductor. These metal pins are therefore arranged so as to be distributed in the liquid channel of the cooler, transversely to the main direction of flow of the coolant, in order to improve the heat transfer between the electronic structural element and the coolant.

Although conventional liquid-cooled cooling bodies have proved to be adequate in the past, they are found to be unsuitable for many of the present-day components with higher and in particular increasing energy consumption.

In the case of another cooling device of this type (US-2005/0143000-A1) [also known as SHOWERPOWER (trademark of Danfoss, Inc.) in practice], three plates arranged a distance apart from one another are provided in a housing, and these plates together form a distributor unit for a coolant for cooling an electronic power component via a cooling plate. The first plate has outlet openings and discharge openings which have a nozzle-like design with the aid of one tubular element each and are connected to a feed channel or discharge channel formed between the adjacent plates. The coolant flows from an inlet through the feed channel, is distributed from there by the openings in the second plate and via the pipelines into the outlet openings of the first plate, penetrates from there to the underside of the cooling plate and flows—with removal of the heat and simultaneous cooling of the power components—through the discharge openings into the discharge channel and from there to the outlet.

In the above arrangement, a distributor apparatus having nozzles is used for transverse transport of the cooling liquid to the metal surface of the semiconductor, with the result that the heat transfer could be increased to a certain extent, but the complicated design of the inlet and outlet nozzles is associated with manufacturing problems. On the other hand, this cooler consists of many elements, and it is for this reason that its assembly or its maintenance requires an unacceptably long time.

It is therefore an object of the present disclosure to provide an improved cooling system of the type mentioned at the outset, which, while being as compact as possible, permits a more effective cooling structure and a lighter, simpler design.

To achieve these goals and others as shall be evident by consideration of this description, accompanying drawings, and appended claims, there are provided systems in which the cooling apparatus has indentations in a cooler wall which are formed transversely or perpendicularly to the cooling channel and are open towards the cooling channel. An insert element having an inner longitudinal channel is inserted into each indentation, an outer longitudinal channel which is connected to the inner longitudinal channel being formed for the coolant between the indentation and the associated insert element. That end of the insert element which engages the cooling channel may be provided with an inclined entry surface and an inlet opening to the inner longitudinal channel. Inclined entry surfaces with the inlet openings of the adjacent insert elements may be arranged offset relative to one another. Instead of the entry surfaces which are inclined per se, it is also possible to provide an inflow channel which connects the entry surfaces and which becomes correspondingly deeper and thus achieves about the same effect as singular inclined entry surfaces on each individual inlet opening. This alternative configuration results in a completely inclined inlet opening along the inflow channel, which inlet opening performs as an inclined inlet surface for each singular entry surface.

Further details and advantages of the invention may also be understood from the description of the Figures.

BRIEF DESCRIPTION OF THE DRAWINGS

Aspects of the invention are described in more detail below with reference to the attached drawings, in which:

FIG. 10 shows a bottom view.

FIG. 11 a cross-section along XI-XI in FIG. 10 on a somewhat larger scale.

FIG. 12 shows a side view.

FIG. 13 shows a perspective side view (cut away).

FIG. 14 shows a perspective top view.

DETAILED DESCRIPTION

Figure 1:
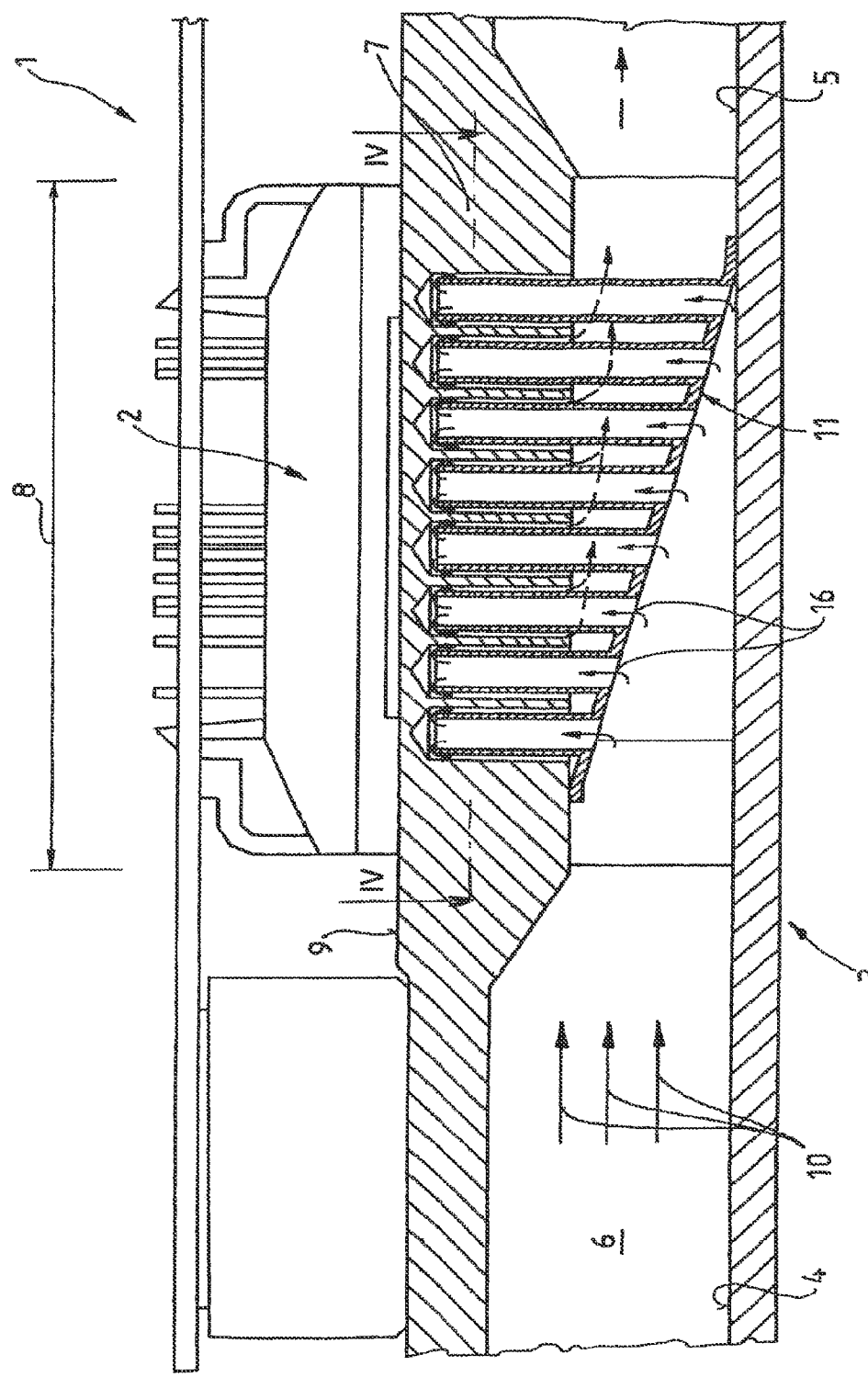
FIG. 1 shows a longitudinal section of a first working example of the cooling system.

The cooling system 1 shown in FIGS. 1 to 5 is suitable in particular for intensive cooling of an electronic structural unit 2 (e.g. power semiconductor, rectifier, etc.) or assemblies. The cooling system 1 is provided with a housing 3 and, therein, with at least one cooling channel 6 having an inflow inlet 4 and an outflow outlet 5 for a coolant. The inflow inlet 4 and the outflow outlet 5 of the cooling channel 6 have additional connections to a tube system (not shown), via which the coolant flow is fed in and removed. For example, a cooling liquid (e.g. water/glycol 50/50%) is chosen as the coolant and—as in the case of a typical cooling circulation—the flow rate of the cooling liquid is chosen as, for example, 6.0 liters/min.

Figure 19:
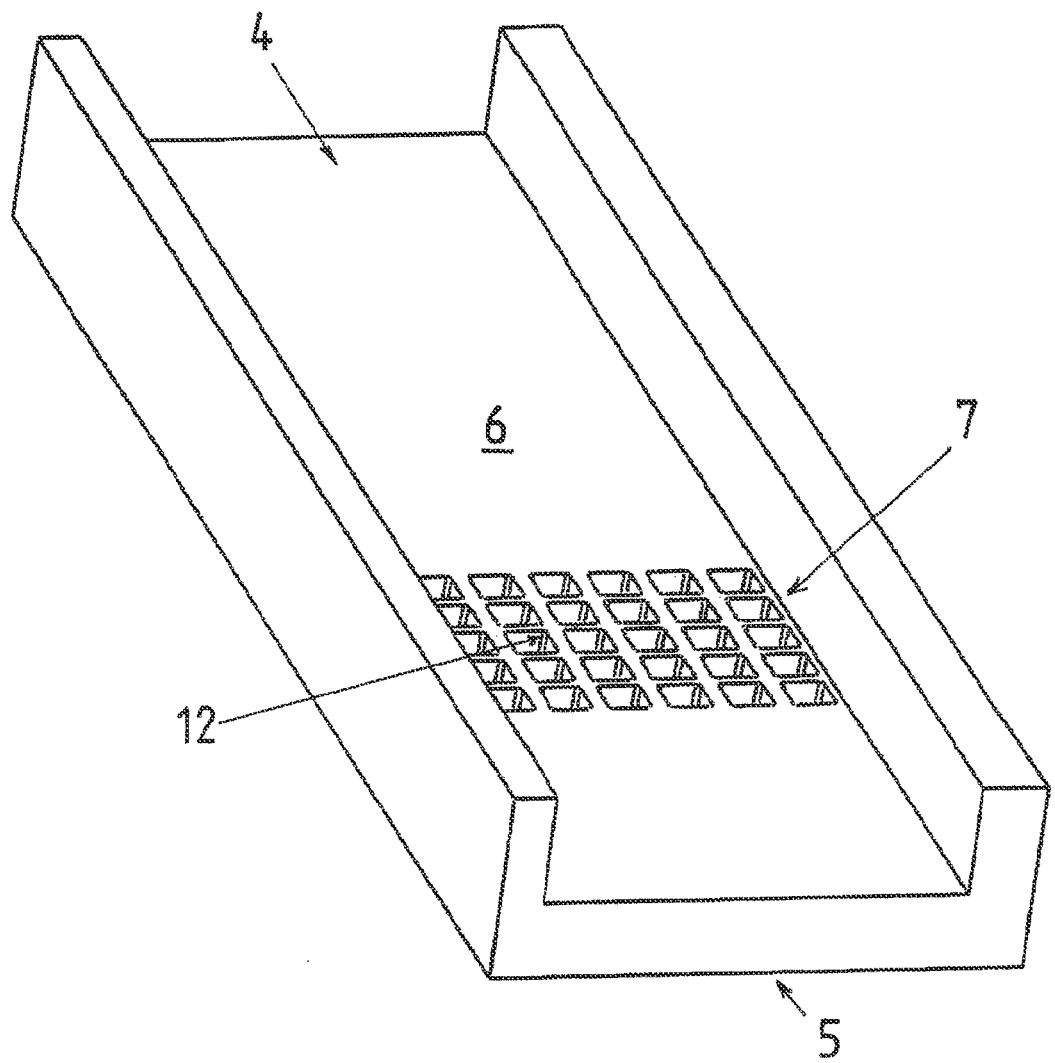
FIG. 19 shows an oblique view of a cooling channel with polygonal recesses without assembled inserts.
Figure 21:
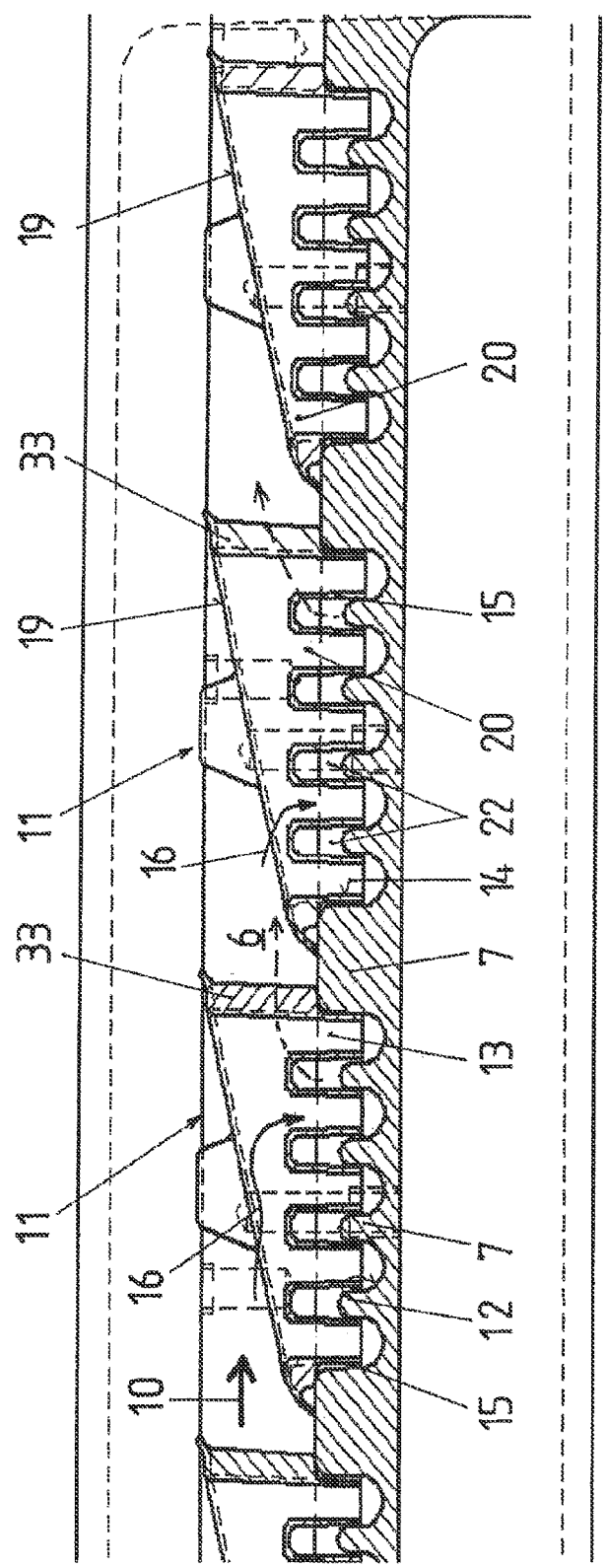
FIG. 21 shows a sectional view through a structure with inserted insert elements whose inlet openings lie in the same horizontal plane.

The electronic structural unit 2 rests over a large area against a heat-conducting cooler wall 7 of the housing 3. In this version, this cooler wall 7 may be produced from aluminum and is thick in its cooling region 8 in a downward direction. In FIG. 1, the electronic structural unit 2 rests with its complete base plate on a flat top 9 of the cooler wall 7. The alternative cooler wall 7 of FIG. 19 is not thick. FIG. 21 shows thick cooler walls 7 again. However, the cooler wall 7 of FIG. 1 is thick over the whole length whereas those walls of FIG. 21 are thick only in their peripheral areas and are relatively thin in their central areas. Thicker walls as in FIG. 1 have more temperature equalizing effects whereas the shape of FIG. 21 allows for a greater quantity of cooling liquid in the same area.

Figure 3:
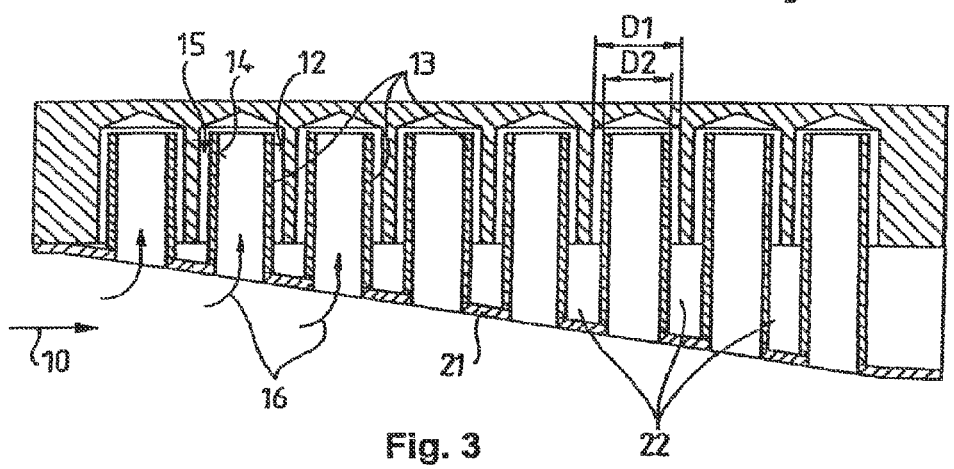
FIG. 3 shows the mutual arrangement of the cooler wall and of the insert elements according to FIG. 1.
Figure 20:
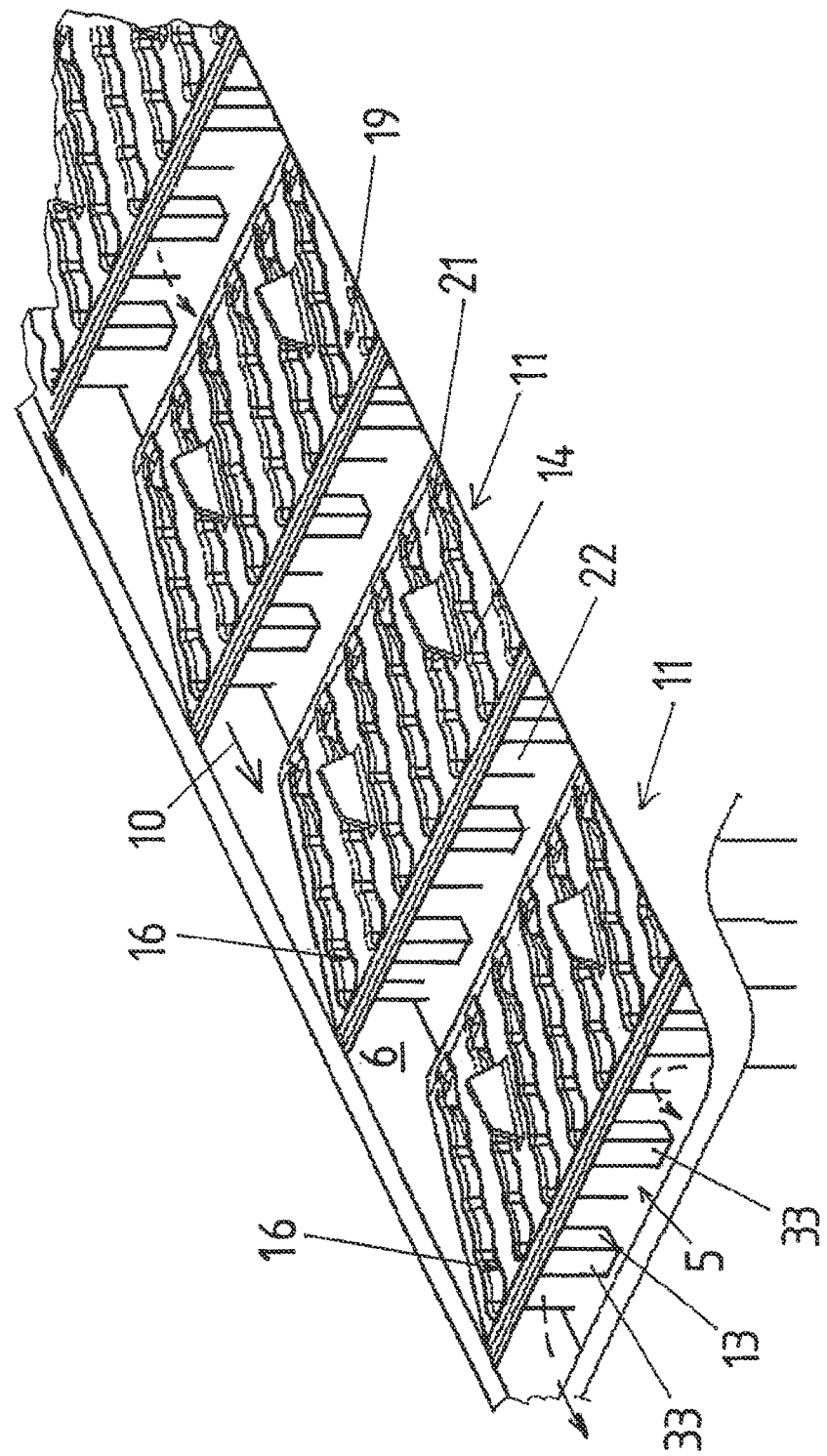
FIG. 20 shows an oblique view of a plurality of inserts with angular shapes and connected inlet openings for use, for example, in a structure according to FIG. 19.

A main direction of flow of the cold cooling liquid stream in the cooling channel 6 is designated by arrows 10 in FIGS. 1, 20 and 21. In the cooling channel 6, an apparatus 11 for distributing and guiding the coolant transversely to the cooler wall 7 is provided. According to the invention, this coolant guide apparatus 11 cooperates with indentations 12 in the cooler wall which are formed so as to be distributed transversely, preferably perpendicularly, to the cooling channel 6, and open from the cooling channel 6. Coolant fluid guide/distributor 11 includes special insert elements 13, an insert element 13 having at least one inner longitudinal channel 14 for the coolant being inserted into each indentation 12 (FIGS. 3, 20, 21). At least one outer longitudinal channel 15 which is in fluid communication with the inner longitudinal channel 14 at indentation 12 bottom is formed, for the coolant, between the indentation 12 and the associated insert element 13. The cold liquid streams deflected perpendicularly upward to ultimately exit through exit channels 22 of the coolant fluid distributor apparatus 11 are designated by arrows 16 in FIGS. 1, 3, 20 and 21.

Figure 14:
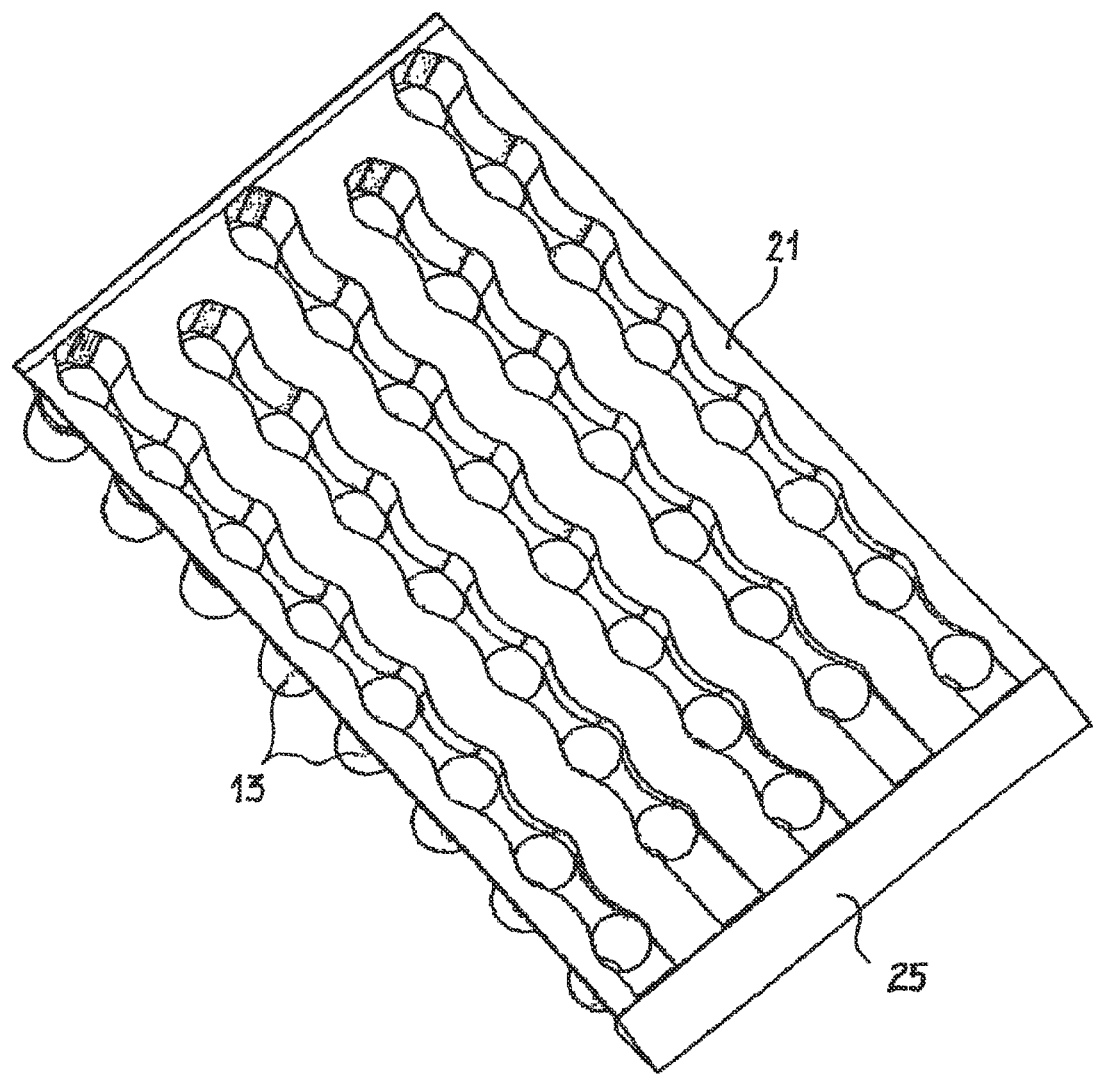

Considering FIGS. 1-3, 6-7 in particular, there is depicted a cooling system 1 for cooling an electronic structural unit 2, which cooling system is provided with a housing 3 and with at least one cooling channel 6 having an inflow 4 and an outflow 5 for coolant. The electronic structural unit 2 may rest over an area against a heat-conducting cooler wall 7 of the housing 3. A coolant guide or distributor apparatus 11 preferably spans the cooling channel 6, its leading edge in contact with the cooler-wall side of the channel 6 and its trailing edge in contact with the opposite side of the channel 6, separating it into the inflow 4 and outflow 5 portions. At least one insert conduit element 13, having an inner longitudinal channel 14 for coolant, inserts into each indentation 12. The insert conduit elements 13 may be in the form of tubes of, for example, circular or polygonal, FIG. 18, cross-section. It is contemplated that each insert element 13 may be provided with a plurality of inner longitudinal channels. The indentations 12 preferably take the form of perpendicular blind bore holes that may, for example, have circular or polygonal cross-section as depicted in FIGS. 4-5 and 15-18. At least one outer longitudinal channel 15 in fluid communication with inner longitudinal channel 14 passes the coolant out of indentations 12 and towards outflow 5. It is also contemplated that a plurality of outer longitudinal channels may be provided to likewise perform this function. It will be understood from the aforegoing remarks that this outer longitudinal channel 15 may take various forms such as, for example, an annular gap, FIG. 16, a gap between an external polygon and internal tube as in FIG. 14, or a gap between external tube and internal polygon as in FIG. 18.

Figure 4:
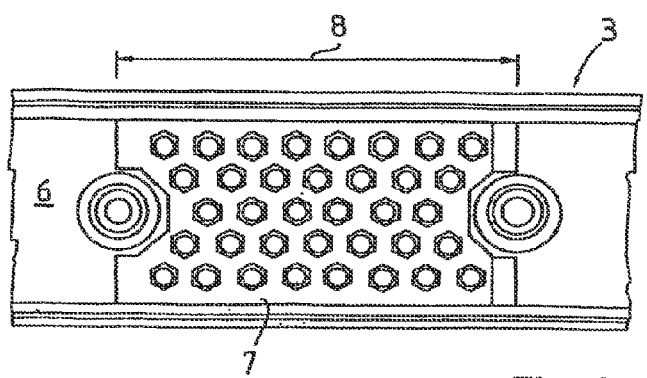
FIG. 4 shows a section along IV-IV in FIG. 1.
Figure 5:
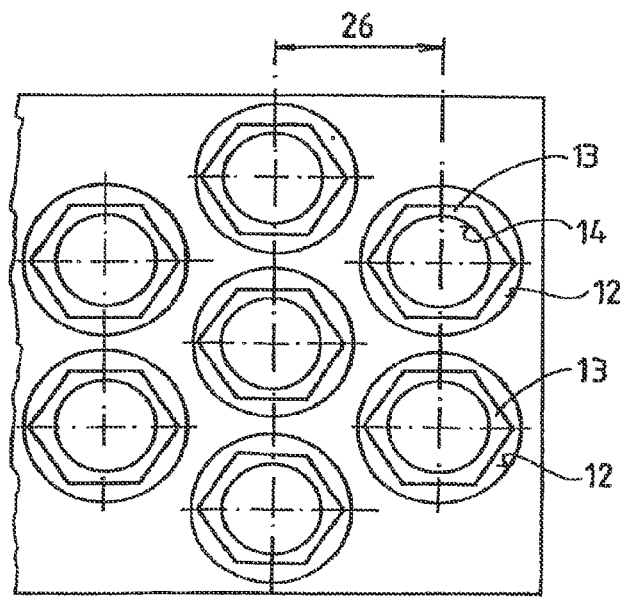
FIG. 5 shows a preferred arrangement variant of the insert elements.

Further considering FIGS. 1-3, 6-7, an upstream end of the insert element 13, into which coolant from inflow 4 enters to inner longitudinal channel 14 via an inlet opening 20, may be provided with an inclined entry surface 19. Considering the several insert conduit elements 13 that may be provided, their respective inclined entry surfaces 19 and inlet openings 20 may be arranged offset relative to one another, as shown in FIGS. 4,5,8, and may lie on a common inclined plane.

In the versions shown, the perpendicular indentations 12 were formed in an underside 17 of the cooler wall 7 as blind holes simply by drilling or milling. Here, the hole ends are preferably conical with an angle 18 of about 120° but it would optionally also be possible to provide spherical or other hole ends. FIGS. 15-20 excluding FIG. 16 show other cross sections. From FIG. 16 it is clear that bigger particles P can not escape as the flow path is equally thin. However solutions like FIGS. 5, 15, 17 and 18 may provide an advantage. They can not clog or block easily by unwanted particles P in the cooling stream.

Figure 2:
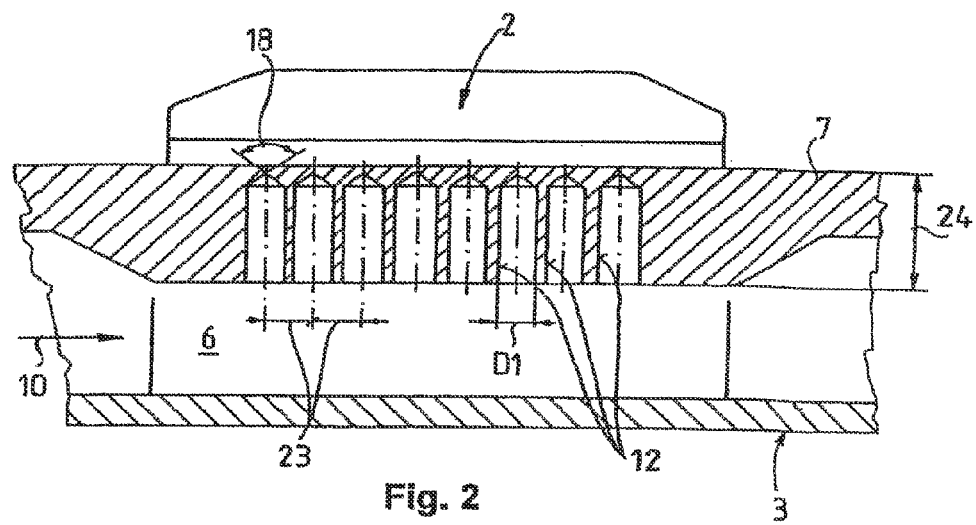
FIG. 2 shows a cross-section detail according to FIG. 1.

The diameter of the blind hole-like perpendicular indentations 12 was designated by reference symbol D1 in FIGS. 3 and 15-18, the value of which diameter was about 5 mm in a working example. In the cooling system 1 according to the invention, the insert conduit elements 13 are preferably tubular elements, i.e. tube sections whose external diameter D2 was chosen as about 4 mm in the embodiment shown. The outer longitudinal channel 15 between the indentation 12 and the associated coaxial insert element 13 is in the form of an annular gap (about 0.5 mm wide) in versions according to FIGS. 1-3, 16-18 and 21. There is therefore a "fine" structure comprising two "coarser" structures. In FIG. 2, the indentations 12 are a distance 23 of about 6 mm apart. The thickness 24 of the cooler wall 7 in the cooling region 8 is about 14 mm.

As shown in FIGS. 1 and 3, the lower end of the insert element 13, which engages the cooling channel 6, is provided with an inclined entry surface 19 and an inlet opening 20 to the longitudinal channel 14, and that the inclined entry surfaces 19 with the inlet openings 20 are arranged offset relative to one another in the case of the adjacent insert elements 13. Preferably, the inclined entry surfaces 19 of the insert conduit elements 13 are arranged in a common inclined plane surface in the longitudinal direction of the cooling channel 6.

In the working examples shown, the insert conduit elements 13 may be produced as a single piece, preferably from plastic or metal however plastic injection molding is quite cheap in production; the inclined entry surfaces 19 of the insert elements 13 are combined to give a common plate 21. Preferably, the adjacent tubular insert elements 13 are connected to one another by ribs in their regions located outside the indentations 12 (FIG. 3), or by indentations, with the result that there are additional connecting channels between the tubular insert elements on the "cold side". Thus, a "support structure" is created which firstly facilitates the manufacture of the complete insert part, for example from plastic, and secondly increases the stability thereof. The stiffening ribs 32 or other elements therefore function as partitions between the adjacent tubular insert elements 13.

Instead of complicated inlet and outlet nozzles (as in the case of the previously mentioned SHOWERPOWER system), according to versions of the invention simple perpendicular cooler wall bores, i.e. indentations 12, along the cooling region 8 are provided, through which the cooling liquid is easily introduced and removed with the aid of a coaxial tubular insert element 13. Within the frame of this invention the entrance opening 20 of the elements 13 could also be connected to flexible tubes or the like and could be fed directly with cooling liquid and not only through the channel 6. In such constructions the channel 6 would only take the heated liquid away.

In the depicted versions of each indentation/insert element unit, the cooling liquid therefore flows at the bottom through the inlet opening 20 into the inner longitudinal channel 14 of the insert element 13. It then flows 16 perpendicularly upward, the direction of flow changes at the top at the end of the cone, it then flows perpendicularly downward in the annular channel (in the outer longitudinal channel 15 between the bore wall and the insert element) and emerges at the bottom into channels 22 and from there into the horizontal main flow. The already heated coolant streams are designated by dashed arrows in FIGS. 1, 6, 20 and 22.

FIGS. 1 and 3 show that the length of the adjacent insert conduit elements 13 in the cooling channel 6 continuously increases in the direction from leading edge to trailing edge of the inclined plate 21. This is an important feature of that variant because a uniform distribution of the flow through all insert elements is achieved thereby and the horizontal flow velocity in all regions can be kept approximately the same. The alternative construction of FIG. 21 is slightly different, as the tubes 13 do not fully extend up to the plane of the inclined entry surface 19 but the effect is similar due to a blocking wall element 33 of this construction. The blocking wall element 33 is depicted in FIGS. 20 and 21.

For the assembly of the electronic structural unit 2 or of a module, a stable and hence relatively thick-walled base or cooler wall 7 is required; it is for this reasons that it is thickened here by 30-50% in the cooling region 8. However, the additional material requirement is small when the blind holes (indentations 12) are produced directly during the manufacture (casting) of the housing 3.

It shall be understood that a relatively thin, large-area water film (formation of the thin annular gap as the "difference" between large structures) may be produced by the use of the coarser structure (i.e. relatively "large blind holes"). There is thus only a very small pressure drop with good heat transfer by a laminar flow of a very thin water film having a large cross-section.

Moreover, the invention permits economical implementation, using blind holes in the housing and using a cheaply producible plastic insert part.

By the use of versions of cooling systems according to the invention, better heat propagation in combination with a smaller construction height than with the conventional "pin-block" system can be achieved. In spite of the smaller construction height, the mechanical stability to sagging of the structure is significantly higher, which ensures good thermal contact, for example between the semiconductor module and the cooling structure. Regarding the good cooling effect itself, the coolant comes very close to the semiconductor but good dry-running properties result since the metallic cooling structure has a significant heat capacity.

As a further feature, it should be mentioned that this structure may be adapted in each case to a given distribution of the heat sources. The indentations can, for example, be located closer together under the chips in order to be able to remove in a concentrated manner the greater heat occurring there.

In the experiments with working examples, the applicant assumed that the flow cross-section of the inner longitudinal channel 14 in the insert element 13 should be approximately equal to or greater than the flow cross-section in the outer longitudinal channel 15 (annular gap), in order to achieve a certain delivery pressure through the perpendicular cooling tubes. It should therefore be understand that the flow velocity in the annular gap, i.e. in the outer longitudinal channel 15, tends to be greater than it should be in the inner longitudinal channel 14 of the insert conduit element 13. Accordingly, the cross-sectional area of the annular gap 15 should therefore preferably be dimensioned somewhat smaller than in the tube since it directly affects the heat transfer there. It is possible that the coolant circulation is contaminated with small particles. These impurities (e.g. foundry sand) may be larger than the annular gap between insert part and blind hole and thus block the channel locally, which permanently adversely affects the flow and hence the cooling effect. In order to counteract this circumstance, in further versions the blind holes do not have a round cross-section but a polygonal cross-section, e.g. a square cross-section. This structure can also be economically produced by die casting methods in aluminium. It has several advantages over the round cross-section:

- With the same cross-section, the cooling surface is larger and the heat transport from the cooling surface into the cooling medium is therefore more efficient.
- The angular gap is widened in the corners of the blind holes so that even larger impurities can pass through the structure unhindered there.
- The tubes of the insert part can be designed in such a way that they are in contact with the walls of the blind holes and are therefore fixed in their position. As a result of this "support", the structure of the insert part can be made thinner and hence more favourable in terms of flow properties.

Figure 15:
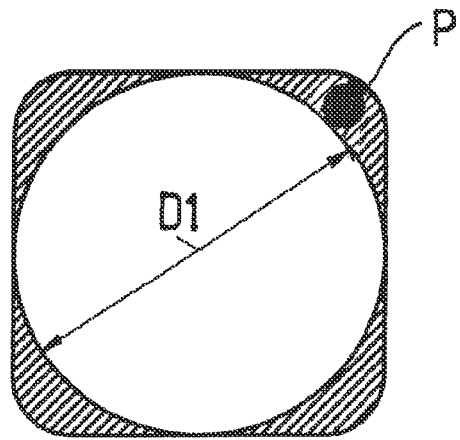
FIG. 15 shows a schematic diagram of a polygonal recess with round insert element.
Figure 16:
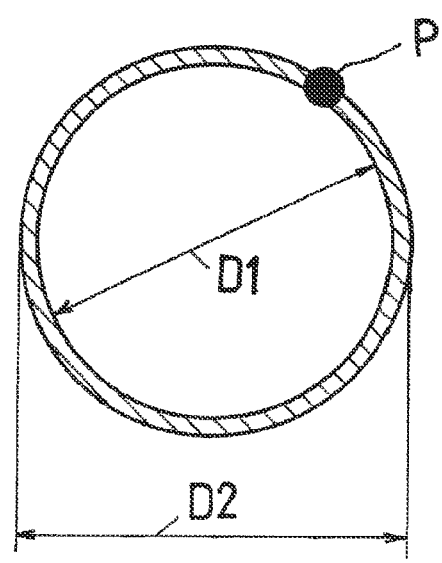
FIG. 16 shows a round recess with the same insert element as in FIG. 15.
Figure 17:
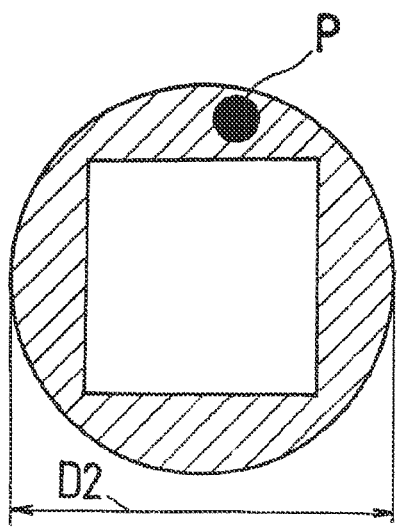
FIG. 17 shows a schematic diagram with round recess and polygonal insert element.

These may be further understood with reference to FIGS. 12 to 15. Two alternatives with identical cross-sectional area of the cooling channel 15 (shaded) are shown here. A round foreign body P (shown as black dot) can pass through the square structure of the indentation 12 but not through the round structure 12. FIG. 16 shows a round recess with the same insert element as in FIG. 15. The geometrical difference and the effect on any small particles in the cooling liquid stream are evident therefrom. In the arrangement of FIG. 15, the particles can be transported and passed, but in the arrangement of FIG. 16, the particles are blocked.

The inclined entry surfaces 19 of the inlet openings 20 in the case of the insert elements 13 permit a pressure build-up in the inflowing coolant. In particular, a uniform distribution of pressure and flow velocity over all inlet openings 20 is important here. A simulation showed that, owing to the low flow velocities of substantially less than 1 m/s, no particular pressure drops in the cooling channel were measured in practice, which is a surprising effect of the invention.

On the other hand, the design, according to versions of the invention, of the flow-conducting insert part results in cool cooling medium always flowing into each inlet opening 20 and each insert element 13 and heated coolant emerging from the annular gaps (outer longitudinal channels 15) not being able to enter the other adjacent inlet openings 20.

Furthermore, the embodiment, according to the invention, of the coolant guide permits a simple arrangement of a plurality of such coolant guides one behind the other in series so that, for example, the same cooling medium flows through a plurality of semiconductor modules in succession, as depicted in FIGS. 20 and 21, in the same cooling circulation or in the same cooling channel. This also ensures that each module is actually cooled with the same flow rate. Owing to the direct, linear path of the flow from the preceding insert part to the next insert part, the pressure drop is particularly small.

In further aspect, the thermally conducting solid cooler plate 7 having blind holes, may be produced, for example, from alloyed aluminum that has a high mechanical stability and good thermal conduction properties. This is advantageous for good thermal contact over a large area with a semiconductor module. This simultaneously permits transport of the cooling medium to a few tenths of a millimeter below the top 9 of the cooler wall 7 which is to be cooled, leading to a smaller temperature difference between cooling medium and module to be cooled. In this context, a simulation by the applicant showed that a conical end of the blind holes with a 120° cone angle gave very advantageous results.

FIGS. 4 and 5 show a preferred arrangement variant of indentations 12 and insert conduits 13. In this embodiment, the tubular insert conduits 13 are provided on the outside with a hexagonal cross-section. On the other hand, the insert conduits 13 were distributed here in the blind hole indentations 12 in a hexagonal shape. This "hexagonal distribution" (so-called honeycomb structure) permits the maximum possible number of holes per unit area. A minimum spacing 26 between the adjacent indentations 12 is about 5.2 mm in this embodiment. Thus, the shortest possible lateral thermal paths are achieved in the cooling body. The effect on the flow is small and in addition the "warm" and "cold" sides of the cooling medium are completely separated from one another by the inclined entry surface 19 (also see FIG. 3). Thus, only cool medium can enter the adjacent inner longitudinal channels 14.

Figure 18:
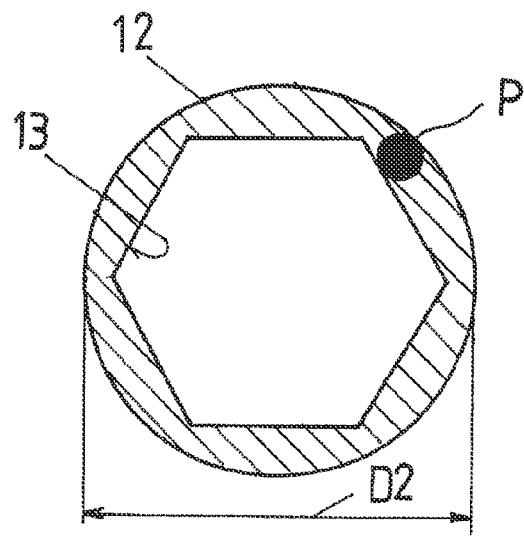
FIG. 18 shows a schematic diagram according to FIG. 5 with particles.

This hexagonal distribution according to FIGS. 4, 5 and 18 has another advantage: particles floating in the cooling liquid of a particular size may circulate freely because of the bigger space in the corners of the indentations of FIG. 4 or between the corners of the elements 13 and the indentation 12 (FIGS. 5 and 18). This effect is also reached with solutions according to FIGS. 15, 17, 19 and 20.

Figure 7:
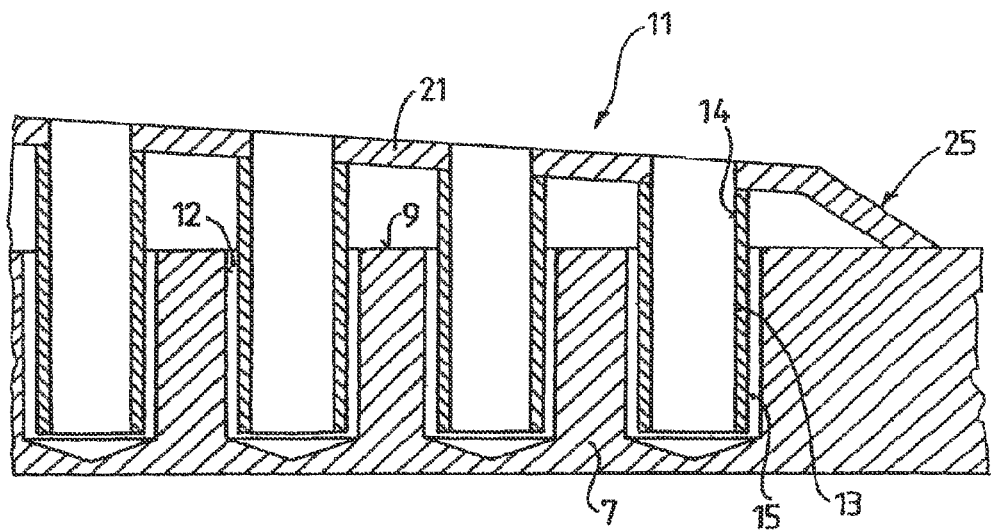
FIG. 7 shows a part of the solution according to FIG. 6 on a larger scale.
Figure 6:
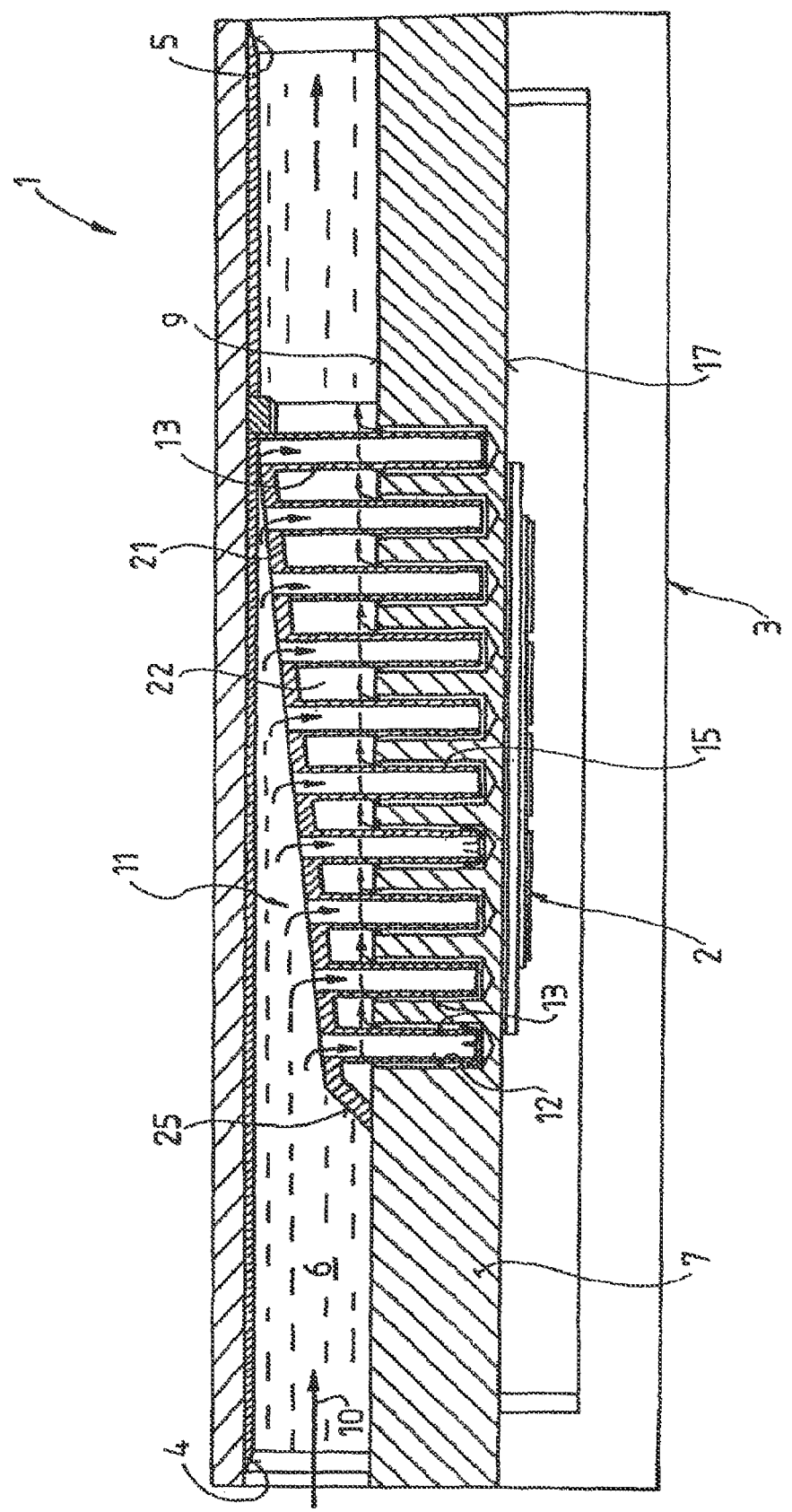
FIG. 6 shows a longitudinal section of a second working example of the cooling system.
Figure 8:
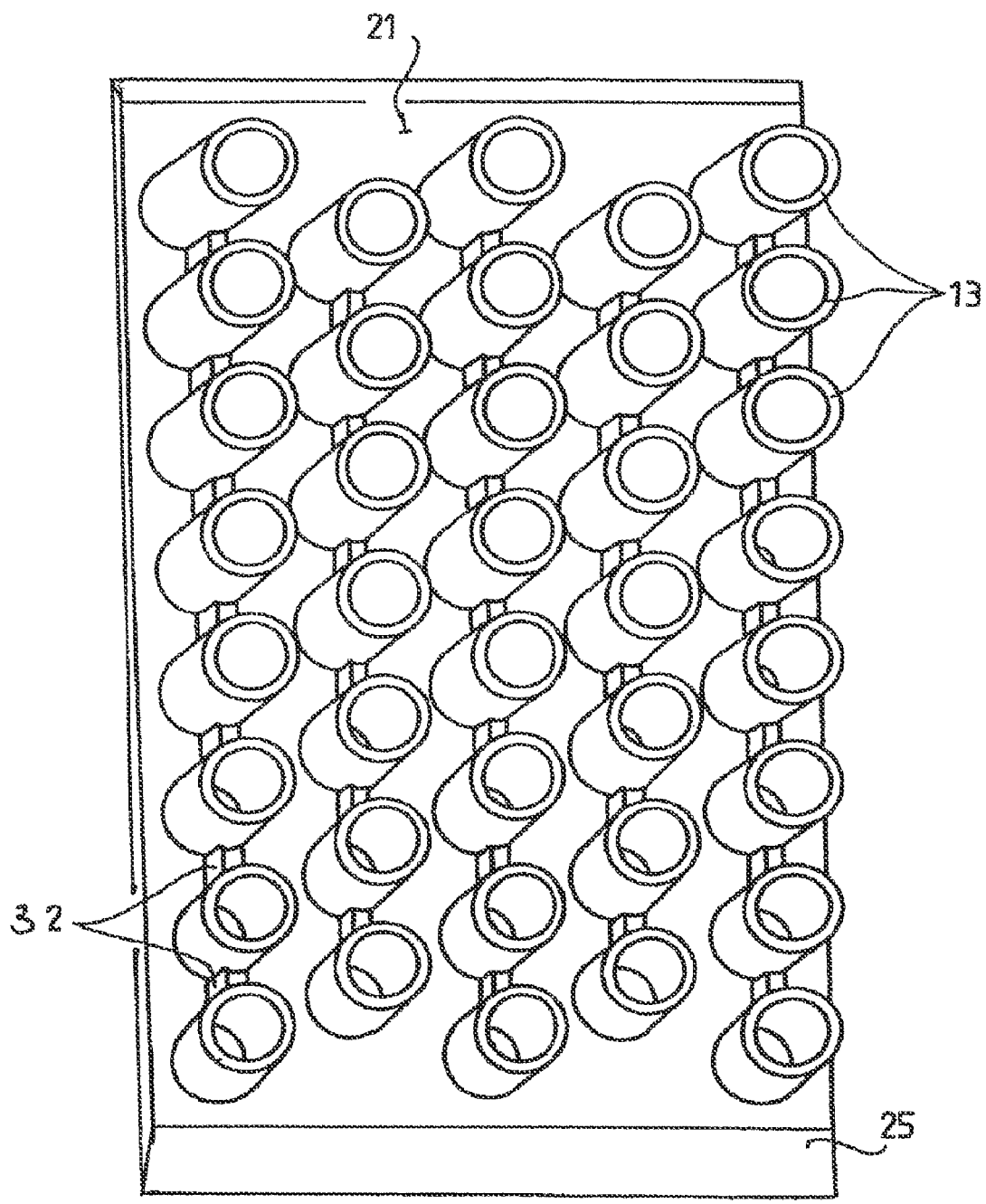
FIG. 8 shows a perspective of a version of the combined insert elements.
Figure 9:
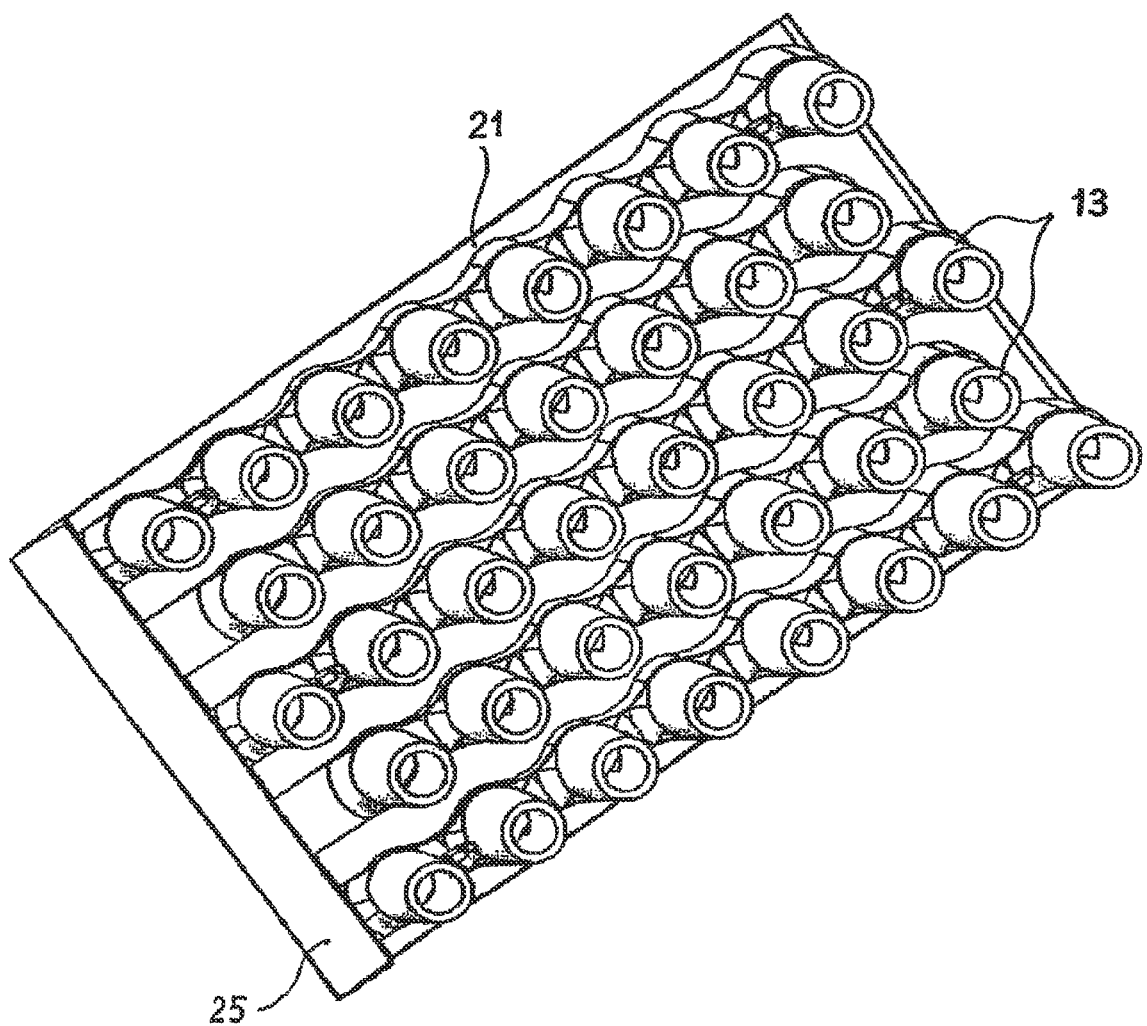
FIGS. 9-14 show diagrams of a variant of the insert piece with an inclined inlet channel as an alternative to FIG. 8, with FIG. 9 showing a bottom perspective view.
Figure 10:
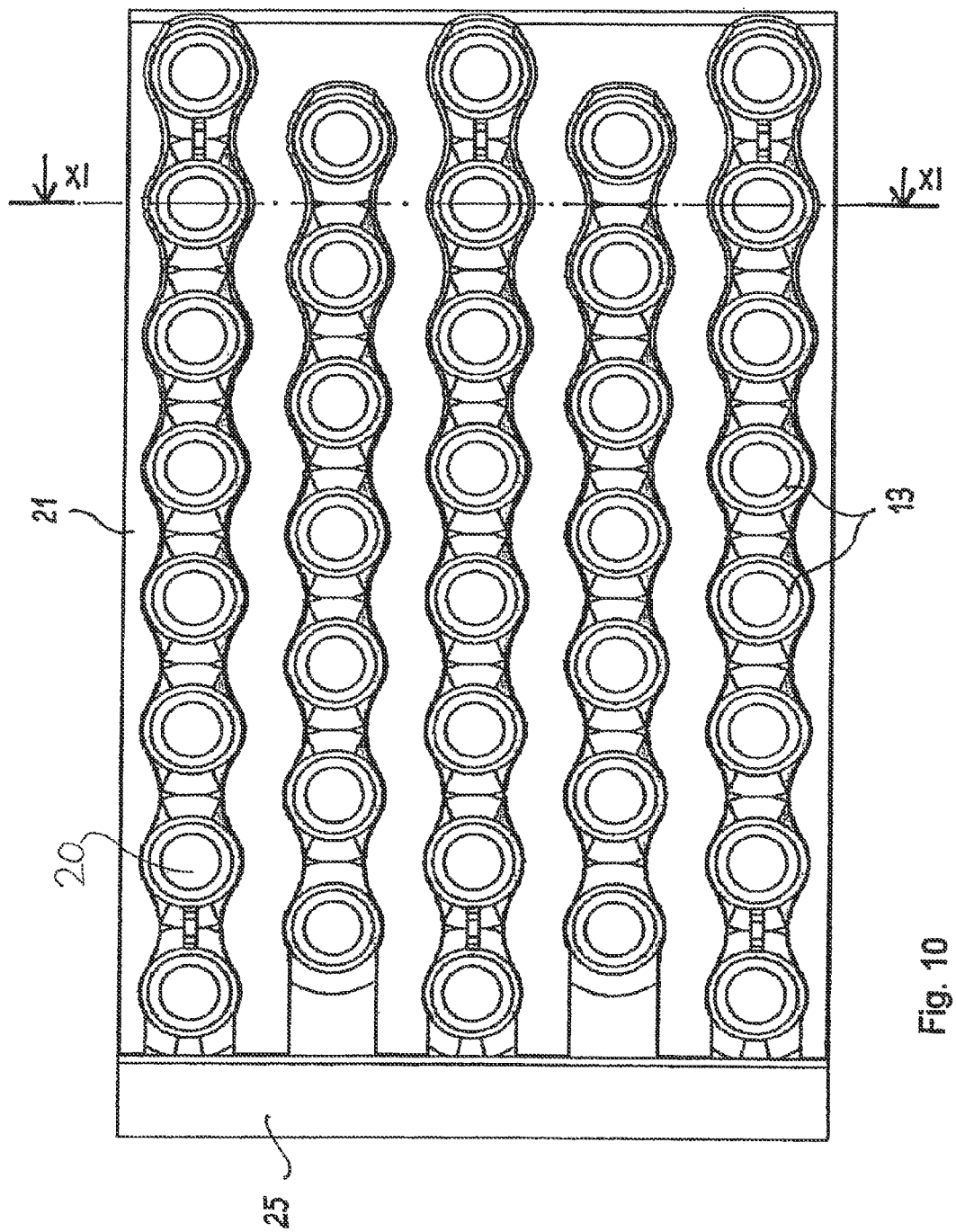

FIGS. 6-8 depict the second working example of the cooling system 1 according to the invention. (The same or similar elements are designated by the same reference numerals.) Regarding the construction and mode of operation, this embodiment substantially corresponds to the first embodiment according to FIG. 1-5.

The more important differences are that here the cooler wall 7 forms the underside of the cooling channel 6 in the housing 3, and the indentations 12 as blind holes in the top 9 of the cooler wall 7 are drilled from the top perpendicularly downward. Analogously, the tubular insert elements 13 here are inserted as a single plastic piece from above into the indentations with an annular gap which forms the outer longitudinal channel 15. The electronic structural unit 2 rests against the flat underside 17 of the cooler wall 7.

FIGS. 6 and 7 show that a steeper bevel 25 (shown mirror-symmetrically in FIG. 7) is provided at the beginning or leading edge (at the "base") of the inclined plate 21. In experimental simulations, it was found that, at the "base", the steeper bevel 25 in the form of a small step is very advantageous, so that the starting cross-sectional area for the first outer longitudinal channels 15 (with the shortest tube lengths) is greater, which results in a more uniform flow distribution. Such an embodiment in which the blind holes begin somewhat further back at the "base" would also be conceivable.

FIG. 8 shows a perspective view of a preferred embodiment of the combined insert elements 13 with the plate 21 and the bevel 25 at the base. The connections between the adjacent insert elements comprise ribs 32, all of which were produced together integrally from plastic. The insert elements 13 may be produced as a single piece, for example of plastic or metal, so that the inclined entry surface 19 is combined to give a common inclined plate 21. The ribs 32 connect the insert elements 13 in regions of the insert elements lying outside the indentations 12 as can be understood in more detail from FIG. 7.

Figure 11:
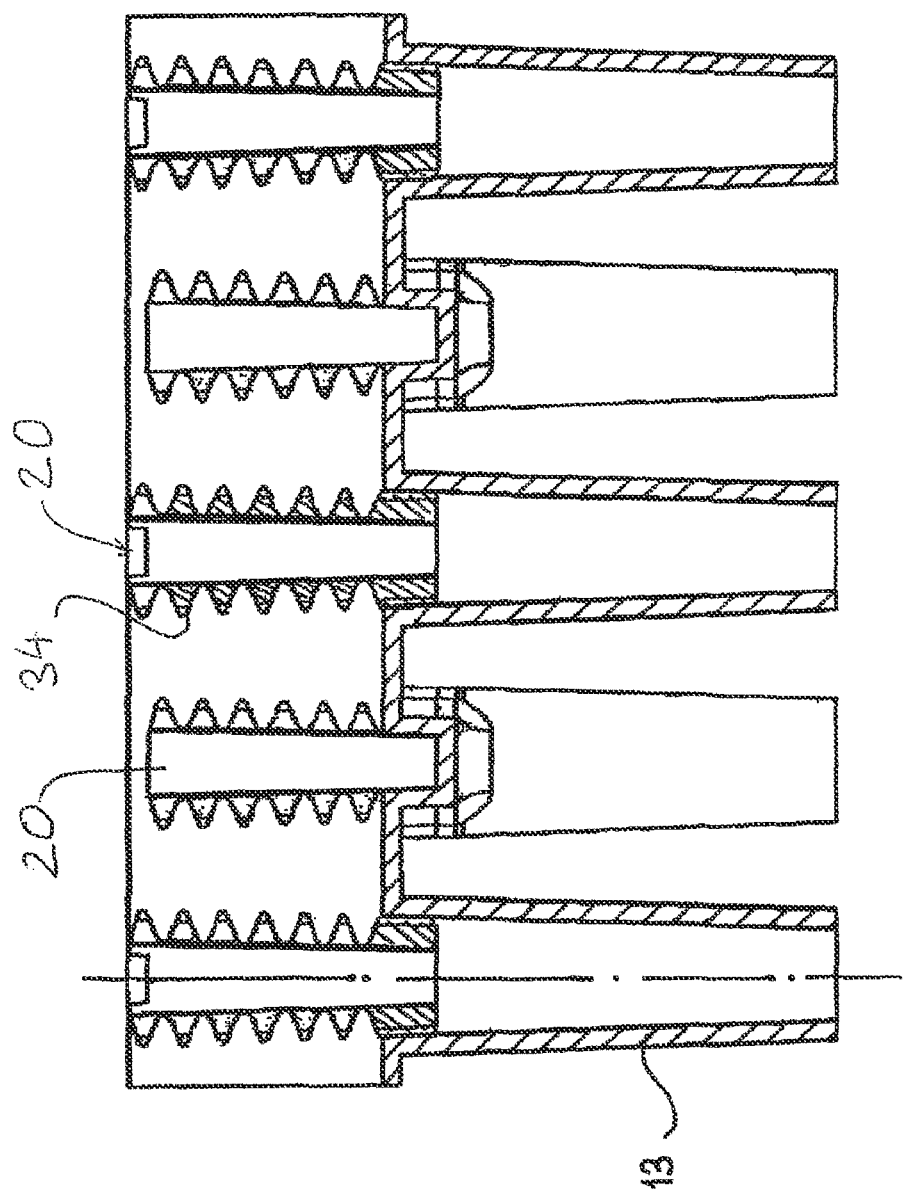
Figure 12:
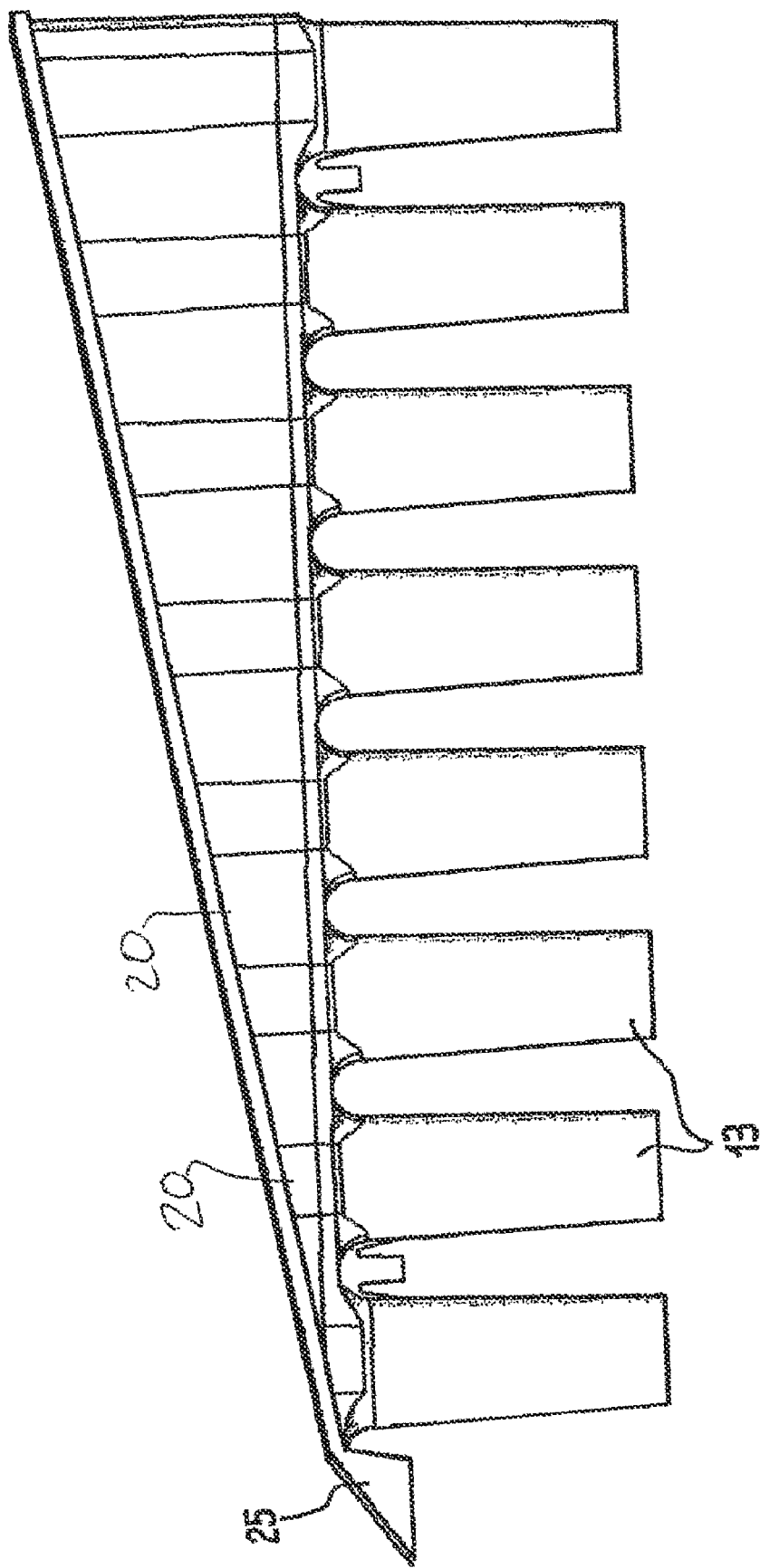
Figure 13:
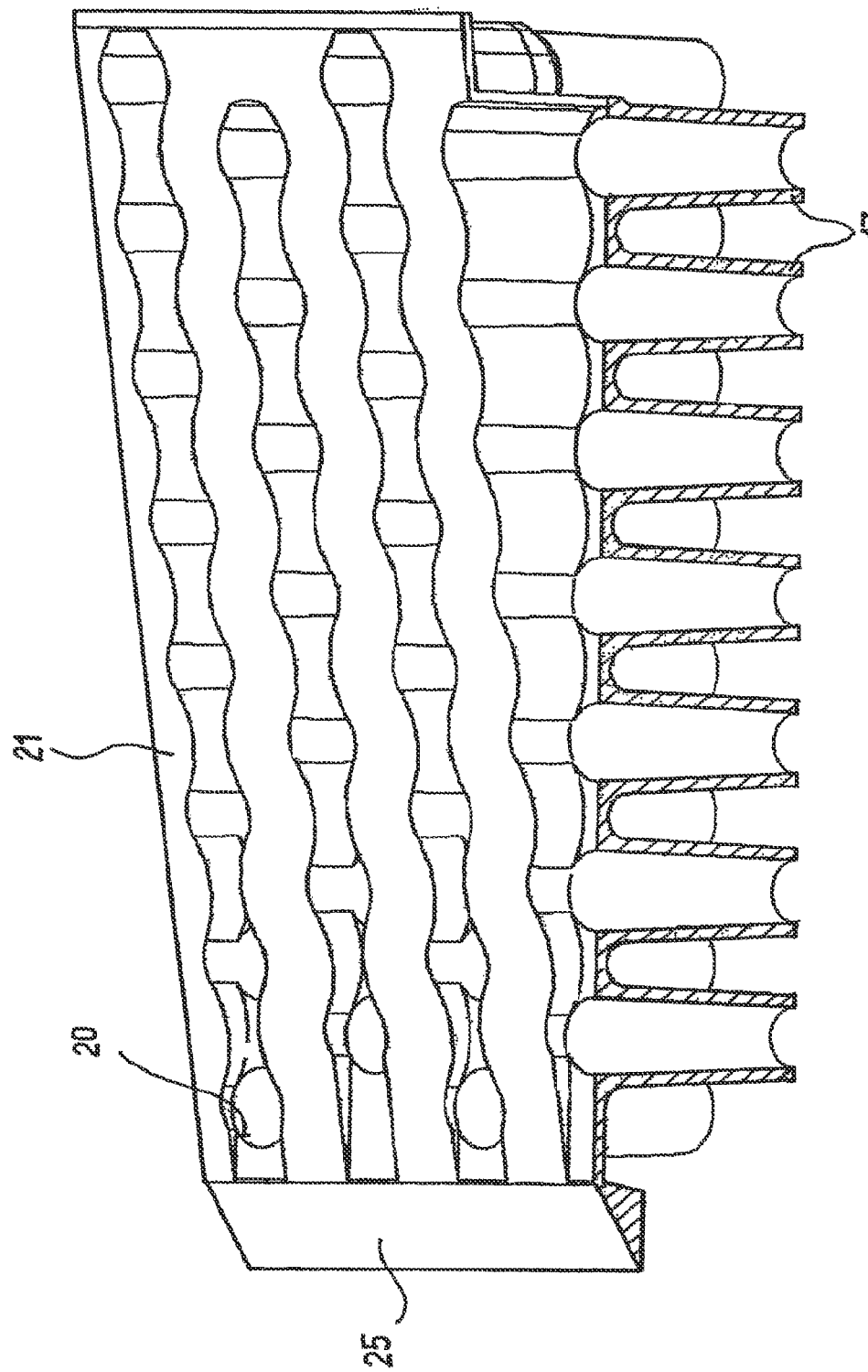

FIGS. 9-14 show a version of the plastic insert piece according to FIG. 8, and identical or similar elements are designated by the same reference numerals. That the discrete inlet openings 20 are located in an inflow channel which itself has a different wall height is to be recognized as a remarkable difference (FIG. 11). The result of this different wall height is that the inlet openings 20, which themselves are now no longer directly inclined, are attributed the same effect as inclined inlet openings from the preceding figures. That open side of the channel which faces the cooling medium acts as a whole as an inclined inlet opening. Furthermore, FIG. 11 discloses rippled flow guides 34. They may affect the flow/laminarity and may help mixing and assist to heat transfer.

Some of the important advantages of the invention are therefore to be regarded as:
uniform distribution of the cooling power,
purposeful cooler construction permitted, i.e. more effective cooling in areas of greater heat evolution,
lateral heat flow still possible,
sufficient bore depth in the cooler wall even without domes,
"coarse" structure (e.g. about 5.2 mm) also realizable by means of casting (if appropriate, injection molding),
plastic part can be economically produced for large series, laminar "siphon" pressure drop with water only about 5 hPa (Hagen-Poiseuille, without inflow, deflection), improvement of the heat transfer between cooling liquid and semiconductor by shortening of the cooling liquid-semiconductor distance, increase in the effective aluminum cross-section, increase in the size of the aluminum-water active surface, avoidance of "dead water" zones in the cooling channel, high mechanical strength with respect to sagging.

Compared with the known arrangements (e.g. finger structure), a cooling system 1 according to the invention shows a substantially better heat transfer between cooling medium and area to be cooled, in combination with the same volume flow and same pressure drop. In addition, the production may be simpler, for example drilling instead of milling, sand casting instead of die casting.

The insert conduits 13 produce a very fine distribution of the flow (e.g. about 0.5 mm annular gap) in spite of a "coarser" structure (e.g. about 5.0 mm blind hole diameter). The known principle of the "difference between similarly large dimensions" is utilized here.

This terminology "difference between similarly large dimensions" describes the manner in which the annular gap results: let the holes be about 5 mm in diameter and the tubes in the insert part about 4 mm. The annular gap is then (5−4)/2=about 0.5 mm wide, i.e. only ⅒ of the hole diameter. Thus, the "fine" structure is obtained from two "coarser" structures.

Finally, it should be noted that the invention is not limited to the abovementioned versions and working examples. Further developments, modifications and combinations are also within the scope of the patent claims and are conceivable for the person skilled in the art from the above disclosure. Accordingly, the techniques and structures described and illustrated herein should be understood to be illustrative only and not limiting upon the scope of the present invention. The scope of the present invention is defined by the appended claims, including known equivalents and unforeseeable equivalents at the time of filing of this application.

A list of reference numerals is provided:

1 Cooling system
2 Electronic structural unit
3 Housing
4 Inflow inlet
5 Outflow outlet
6 Cooling channel
7 Cooler wall
8 Cooling region
9 Top
10 Arrow indicating flow
11 Coolant fluid guide and distributor apparatus
12 Indentation
13 Insert conduit element
14 Inner longitudinal channel
15 Outer longitudinal channel
16 Arrow indicating flow
17 Underside
18 Angle
19 Inclined entry surface
20 Inlet opening
21 Inclined plate
22 Exit channels
23 Distance
24 Thickness
25 Bevel
26 Distance
D1 Diameter of the indentation 12 (e.g. blind hole)
D2 External diameter of insert element 13 tube section
P foreign body particle
32 stiffening ribs
33 blocking wall element
34 rippled flow guides

What is claimed is:

1. A cooling system for an electronic structural unit, comprising:
   a housing;
   a cooling channel in said housing, said cooling channel having an inlet, said cooling channel having an outlet;
   a heat-conducting cooler wall located on a first side of said channel;
   a plurality of indentations in said cooler wall, said indentations open from said channel;
   a first coolant guide spanning said cooling channel, said coolant guide having an inclined entry surface member;
   said inclined entry surface member having a leading edge upstream towards said channel inlet, said leading edge contacting said first side of said channel on which said heat-conducting wall is located;
   said inclined entry surface member having a trailing edge downstream towards said channel outlet, said trailing edge contacting another side of said channel opposite to said first side;
   said inclined entry surface member spanning said cooling channel transversely and having a plurality of inclined inlet openings, said inlet openings having respective insert conduits associated therewith; and,
   said insert conduits depending from said inclined inlet openings at an angle bringing them into alignment with said plurality of indentations in said cooler wall, said insert conduits respectively being inserted into respective indentations so that respective insert conduits pass coolant flow from said cooling channel into respective indentations.

2. A cooling system for an electronic structural unit as claimed in claim 1, further comprising;
   said insert conduits having respective inner longitudinal channels;
   respective outer longitudinal channels formed between said insert conduits and the respective indentations into which said insert conduits are inserted; and,
   said inner longitudinal channels and said insert conduits being configured to pass coolant flow from said cooling channel inlet to said cooling channel outlet via said indentations in said cooler wall.

3. The cooling system for an electronic structural unit as claimed in claim 2, wherein:
   said outer longitudinal channels each have the form of a respective annular gap.

4. The cooling system for an electronic structural unit as claimed in claim 2, wherein:
   said outer longitudinal channels have smaller cross-sectional areas than said inner longitudinal channels.

5. The cooling system for an electronic structural unit as claimed in claim 2, wherein:
   said insert conduits have a polygonal circumferential profile.

6. The cooling system for an electronic structural unit as claimed in claim 1, wherein:
   said plurality of inclined openings are arranged in offset relative to one another.

7. The cooling system for an electronic structural unit as claimed in claim 1, wherein:
   said plurality of indentations in said cooler wall each have the form of a respective perpendicular blind bore.

8. A cooling system for an electronic structural unit as claimed in claim 1, further comprising:
a bevel portion at said leading edge of said inclined entry surface member.

9. A cooling system for an electronic structural unit as claimed in claim 1, further comprising:
stiffening ribs on a bottom side of said inclined entry surface member.

10. A cooling system for an electronic structural unit as claimed in claim 1, further comprising:
a second coolant guide situated in series with said first coolant guide to receive coolant exhausted from said indentations.

11. A cooling system for an electronic structural unit, comprising:
a housing;
a cooling channel in said housing, said cooling channel having an inlet, said cooling channel having an outlet;
a heat-conducting cooler wall located on a first side of said channel;
a plurality of indentations in said cooler wall, said indentations open from said channel;
a first coolant guide spanning said cooling channel, said coolant guide having an inclined entry surface member;
said inclined entry surface member having a leading edge upstream towards said channel inlet, said leading edge contacting said first side of said channel on which said heat-conducting wall is located;
said inclined entry surface member having a trailing edge downstream towards said channel outlet, said trailing edge contacting another side of said channel opposite to said first side;
said inclined entry surface member spanning said cooling channel transversely and having a plurality of inflow channels, said inflow channels having a varying wall height increasing in the direction from said leading edge to said trailing edge;
a plurality of inlet openings, said inlet openings located at bottoms of said inflow channels; and,
respective insert conduits associated with said inlet openings, said insert conduits disposed at an angle relative to said inclined entry surface member that brings the insert conduits into alignment with said plurality of indentations in said cooler wall, said insert conduits respectively being inserted into respective indentations so that respective insert conduits pass coolant flow from said cooling channel into respective indentations.

12. The cooling system for an electronic structural unit as claimed in claim 11, wherein:
said inflow channels are arranged in parallel.

13. The cooling system for an electronic structural unit as claimed in claim 12, wherein:
said inlet openings are arranged in offset relative to one another, in adjacent ones of said parallel inflow channels.

14. A cooling system for an electronic structural unit as claimed in claim 11, further comprising:
a bevel portion at said leading edge of said inclined entry surface member.

15. The cooling system for an electronic structural unit as claimed in claim 14, wherein:
said coolant guide is a unitary plastic piece that includes said entry surface member, said inflow channels, said openings, said insert conduits, and said bevel portion.

16. A cooling system for an electronic structural unit as claimed in claim 11, further comprising:
a second coolant guide situated in series with said first coolant guide to receive coolant exhausted from said indentations.

17. A coolant guide for an electronic structural unit cooling system, comprising:
an inclined entry surface member;
said inclined entry surface member having a leading edge, and said inclined entry surface having a trailing edge;
said inclined entry surface member having a plurality of inflow channels, said inflow channels having a varying wall height increasing in the direction from said leading edge to said trailing edge;
a plurality of inlet openings, said inlet openings located at bottoms of said inflow channels; and,
respective insert conduits associated with said inlet openings, said insert conduits disposed at an angle relative to said inclined entry surface member.

18. The coolant guide for an electronic structural unit cooling system as claimed in claim 17, wherein:
said inflow channels are arranged in parallel; and,
said inlet openings are arranged in offset relative to one another, in adjacent ones of said parallel inflow channels.

19. A coolant guide for an electronic structural unit cooling system as claimed in claim 17, further comprising:
a bevel portion at said leading edge of said inclined entry surface member.

20. A coolant guide for an electronic structural unit cooling system, comprising:
an entry surface plate member;
said entry surface plate member having a leading edge, and said entry surface plate member having a trailing edge;
said entry surface plate member having a plurality of inclined inlet openings extending therethrough, said inclined inlet openings having respective insert conduits associated therewith;
said insert conduits depending from a bottom side of said entry surface plate, at an angle relative to said entry surface plate member;
said insert conduits are arranged in respective parallel rows;
respective stiffening ribs run between the insert conduits of a respective parallel row.

21. The coolant guide for an electronic structural unit cooling system as claimed in claim 20, wherein:
said inlet openings and said insert conduits are arranged in offset relative to one another, in adjacent ones of said respective parallel rows.

22. The coolant guide for an electronic structural unit cooling system as claimed in claim 20, wherein:
said stiffening ribs have a varying height increasing in the direction from said leading edge to said trailing edge.

* * * * *